United States Patent
Shrivastava et al.

(10) Patent No.: US 10,200,052 B2
(45) Date of Patent: Feb. 5, 2019

(54) ANALOG-TO-DIGITAL CONVERTER (71) Applicant: TEXAS INSTRUMENTS INCORPORATED, Dallas, TX (US)

(72) Inventors: Neeraj Shrivastava, Bangalore (IN); Jafar Sadique Kaviladath, Kozhikode (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/859,437

(22) Filed: Dec. 30, 2017

(65) Prior Publication Data
US 2019/0013816 A1 Jan. 10, 2019

(30) Foreign Application Priority Data
Jul. 6, 2017 (IN) .............................. 201741023732

(51) Int. Cl.
*H03M 1/12* (2006.01)
*H03M 1/00* (2006.01)
*H03M 1/14* (2006.01)
*H03M 1/16* (2006.01)

(52) U.S. Cl.
CPC ........... *H03M 1/001* (2013.01); *H03M 1/146* (2013.01); *H03M 1/164* (2013.01)

(58) Field of Classification Search
CPC ...... H03M 1/164; H03M 1/146; H03M 1/468; H03M 1/125; H03M 1/145; H03M 1/442; H03M 1/1245
USPC .......................... 341/122, 155, 160, 161, 172
See application file for complete search history.

(56) References Cited

U.S. PATENT DOCUMENTS

| | | | | |
|---|---|---|---|---|
| 7,283,083 B1* | 10/2007 | Kamal | ................ | H03M 1/0624 341/160 |
| 2009/0243900 A1* | 10/2009 | Kawahito | ............. | H03M 1/144 341/118 |
| 2009/0289827 A1* | 11/2009 | Elliott | ................. | H03M 1/1245 341/161 |
| 2010/0182176 A1* | 7/2010 | Kawahito | ............... | H03M 1/00 341/122 |

(Continued)

FOREIGN PATENT DOCUMENTS

| | | |
|---|---|---|
| CN | 105915218 A | 8/2016 |
| EP | 2587674 A2 | 5/2015 |
| RU | 2341017 C2 | 4/2008 |

OTHER PUBLICATIONS

PCT Search Report for Application No. PCT/US2018/040987, dated Oct. 18, 2018.

*Primary Examiner* — Linh Nguyen
(74) *Attorney, Agent, or Firm* — Andrew Viger; Charles A. Brill; Frank D. Cimino (57) ABSTRACT

In some examples, a system comprises an analog-to-digital converter (ADC) to receive an analog input signal and a reset signal, the ADC to convert the analog input signal into a digital signal. The system comprises a digital-to-analog converter (DAC), coupled to the ADC, to convert the digital signal into an internal analog signal. The system includes a first capacitor, coupled to the DAC, to receive the internal analog signal. The system comprises a first switch, coupled to the first capacitor, to provide the analog input signal to the first capacitor. The system comprises a second switch to couple the first capacitor to ground.

10 Claims, 5 Drawing Sheets

(56) References Cited

U.S. PATENT DOCUMENTS

| | | | |
|---|---|---|---|
| 2011/0001647 A1* | 1/2011 | Veeder | H03M 1/164 341/146 |
| 2011/0012765 A1* | 1/2011 | Hsieh | G11C 27/024 341/143 |
| 2011/0095930 A1* | 4/2011 | Buter | H03M 1/0614 341/172 |
| 2012/0026026 A1* | 2/2012 | Kabir | H03M 1/1225 341/158 |
| 2012/0162000 A1* | 6/2012 | Gotoh | H03M 1/06 341/172 |
| 2015/0263757 A1 | 9/2015 | Joish | |
| 2017/0237268 A1* | 8/2017 | Brannick | H03M 1/52 378/91 |

* cited by examiner

ANALOG-TO-DIGITAL CONVERTER

CROSS-REFERENCE TO RELATED APPLICATIONS

The present application claims priority to Indian Provisional Patent Application No. 201741023732, which was filed Jul. 6, 2017, is titled "A Circuit Technique for the Stage1 Flash That Enables Low Power, High Performance Frontend Architecture," and is hereby incorporated herein by reference in its entirety.

BACKGROUND

Analog-to-digital converters (ADC) are used in communication systems. As communication systems are developed to use higher frequencies, higher speed ADCs may be required. High-speed ADCs may use a pipeline architecture, in which the analog-to-digital conversion is performed over multiple stages.

SUMMARY

In some examples, a system comprises an analog-to-digital converter (ADC) to receive an analog input signal and a reset signal, the ADC to convert the analog input signal into a digital signal. The system comprises a digital-to-analog converter (DAC), coupled to the ADC, to convert the digital signal into an internal analog signal. The system includes a first capacitor, coupled to the DAC, to receive the internal analog signal. The system comprises a first switch, coupled to the first capacitor, to provide the analog input signal to the first capacitor. The system comprises a second switch to couple the first capacitor to ground.

In some examples, a system comprises an analog-to-digital converter (ADC) to receive an analog input signal and a reset signal, the ADC to convert the analog input signal into a digital signal, the ADC to be reset when the reset signal is in an asserted state. The system comprises a digital-to-analog converter (DAC), coupled to the ADC, to convert the digital signal into an internal analog signal. The system comprises a capacitor coupled to the DAC and an amplifier coupled to the capacitor. The capacitor is to receive the analog input signal while the reset signal is in a deasserted state to an asserted state and while the ADC converts the analog input signal into the digital signal. The capacitor is to receive the internal analog signal while the reset signal transitions from the deasserted state to the asserted state. The capacitor is to provide a modified analog signal to the amplifier. The modified analog signal is based on a combination of the analog input signal and the internal analog signal.

In some examples, a method comprises receiving, by an analog input, an analog voltage value; storing the analog voltage value on a capacitor; converting, by an analog-to-digital converter (ADC), the analog voltage value to a digital voltage value; converting, by a digital-to-analog converter (DAC), the digital voltage value to an internal analog voltage value; subtracting the internal analog voltage value from the analog voltage value stored on the capacitor by providing the internal analog voltage value to the capacitor; and resetting the ADC after the ADC has converted the analog voltage value to a digital value and before the internal analog voltage value is provided to the capacitor.

BRIEF DESCRIPTION OF THE DRAWINGS

For a detailed description of various examples, reference will now be made to the accompanying drawings in which.

DETAILED DESCRIPTION

ADCs are used to convert analog signals into digital signals. For example, ADCs are used in cell phone systems to convert analog signals received via antennas (either in the phone or in a cell tower) into digital signals used by cell phones and the telephone system. As new standards for cell phones are developed, they often use high frequency radio waves to transmit between the cell phones and cell towers. Using high frequency radio waves requires the use of ADCs that can perform the analog to digital conversion at fast rates to avoid data loss. To speed up the conversion process, ADCs can use a pipelined architecture. In a pipelined ADC, the analog to digital conversion is completed in stages. An initial pipeline stage for a 12-bit ADC might only resolve the 4 most-significant bits and calculate a residue voltage (representing the analog signal minus the equivalent analog value of the 4 most-significant bits) for resolution by the remaining stages. At fast ADC rates, the pipeline stage may have difficulties efficiently and accurately resolving the bits and calculating the residue voltage in the allotted time.

Adding a capacitor to sample and hold the value of an analog input allows the analog input to accept a new value as the sub-ADC performs the analog to digital conversion on a stable signal. Adding a buffer to the residue voltage calculating path may allow both the analog-to-digital conversion path and residue voltage calculating path to use the value stored on the capacitor. Transitioning the reset signal for the sub-ADC from a deasserted to an asserted state after the analog to digital conversion is completed, but before the residue voltage calculation is complete may reduce errors caused by operation of the sub-ADC (such as charge sharing of capacitors). Such modifications may allow sufficient time for resolving the bits of the stage and calculating the residue voltage, while preparing for receipt of the next voltage value.

Figure 1:
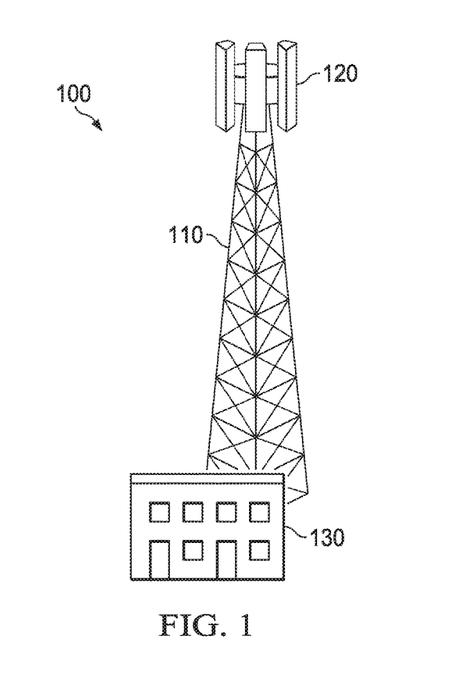
FIG. 1 depicts a cell phone tower, in accordance with various examples.

FIG. 1 depicts a cell phone tower 100, in accordance with various examples. A cell phone tower 100 may be used as part of a communications system for communicating with cell phones. A cell phone tower may include a scaffold 110 for supporting equipment, such as antennas 120, at an elevated height. A cell phone tower may include an equipment shed 130, in which electrical equipment is stored. The electrical equipment for a cell phone tower 100 may include a power supply, a Global Positioning System (GPS) receiver, amplifiers, ADCs, and DACs. In various examples, some equipment, such as amplifiers, ADCs, and DACs, may be mounted on the scaffold 110 or be housed in the shed 130. In some examples, the antennas 120 may be mounted on a building using minimal or no scaffolding and may store equipment inside the building instead of having a separate shed 130. The ADCs stored in the shed 130 and used in the communications application of FIG. 1 may implement the pipelining techniques described herein, although the pipelining techniques may be applied in other contexts and applications as well.

Figure 2:
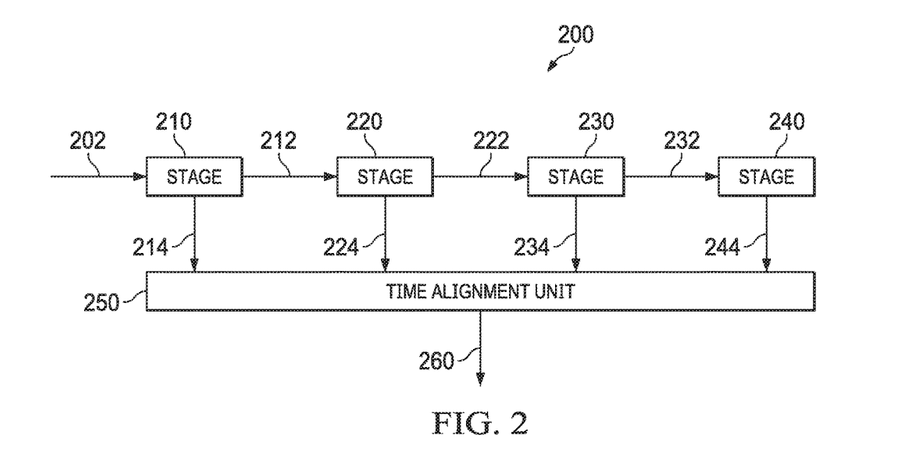
FIG. 2 depicts a block diagram of an ADC pipeline, in accordance with various examples.

FIG. 2 depicts a block diagram of an ADC pipeline 200, in accordance with various examples. An ADC pipeline 200 may include an analog input voltage 202, one or more stages 210, 220, 230, 240, and a time alignment unit 250. FIG. 2 depicts an ADC pipeline with four stages 210, 220, 230, 240, though a different number of stages may be used. An ADC pipeline 200 may include residue voltages 212, 222, 232 transmitted between the stages. The ADC pipeline 200 may include bit information 214, 224, 234, 244 transmitted from the stages 210, 220, 230, 240, respectively, to a time alignment unit 250. The ADC pipeline 200 may include a digital output value 260 including a digital representation of the analog input voltage 202.

The ADC pipeline 200 may have a range of voltages it can convert, such as voltages between −20 Volts (V) and +20 V. Other ranges of an ADC pipeline 200 are contemplated. An ADC pipeline 200 may also have a range that only covers positive voltage values or only negative voltage values. An analog input voltage 202 may undergo signal conditioning to fall within the voltage range of the ADC pipeline 200. For example, if an ADC pipeline 200 has a voltage range of −10 V to +10 V, an analog input voltage 202 value of +100 V may be clamped, attenuated, or otherwise modified to a value of +10 V. Such signal conditioning may be done to prevent damage to the ADC pipeline 200. An analog input voltage 202 may undergo signal conditioning to closely match its full range of potential values to the voltage range of the ADC pipeline 200. For example, an analog input signal (which may comprise one or more analog input voltage 202 values with voltage values changing over time) may have a range of analog input voltage 202 values from −20 V to +20 V. Such an analog input signal may be scaled (such as by an attenuator) to a range of −10 V to +10 V to closely match a possible −10 V to +10 V range of an ADC pipeline 200. By way of another example, an analog input signal with a range of analog input voltage 202 values from −1 V to +1 V may be scaled (such as by an amplifier) to a range of −10 V to +10 V to closely match a potential −10 V to +10 V range of an ADC pipeline 200.

An amplifier may be a unity gain amplifier. A unity gain amplifier does not amplify or attenuate the voltage value, but may be used to provide additional current. A unity gain amplifier may be used as a buffer. An analog input signal may also undergo signal conditioning to change a voltage offset. For example, an analog input signal with a range of −2 V to +8 V may be modified to have a range between −5 V and +5 V or a range of 0V to +10 V. An ADC pipeline 200 may be specified by a number of bits, such as 8-bit, 12-bit, or 15-bit. For example, an ADC pipeline 200 may perform an 18-bit conversion, where the analog input voltage 202 may be converted into an 18-bit digital output value 260 representing the analog input voltage 202 value.

The first stage 210 will now be described, though much of this description may also apply to the other stages 220, 230, 240. An analog input voltage 202 may be provided to the first stage 210 of the ADC pipeline. The first stage 210 may convert the analog input voltage 202 into bit information 214 and residue voltage 212. Bit information 214 may include one or more bits representing the voltage value of the analog input voltage 202. For example, a 4-bit first stage 210 with a range of −10 V to +10 V may convert an analog input voltage 202 of −10 V to a bit pattern of 1111, an analog input voltage 202 of 0 V into a bit pattern of 0000, and an analog input voltage 202 of +10 V into a bit pattern of 0111. A bit pattern of 0010 may represent an analog input voltage 202 with a voltage value between 0 V and +10 V. In various examples, a bit pattern of 1000 in binary coded decimal may or may not be used to represent a voltage value. In various examples, a bit pattern of 1000 in binary coded decimal may represent an error condition. In various examples, the bit pattern may be in binary coded decimal. In various examples, the bit pattern may or may not include a sign bit. In various examples, other encoding methods, such as Gray coding, may be used. Due to the resolution provided by the number of bits in the bit information 214 of a first stage 210, multiple different voltage values may correspond to the same bit pattern. For example, voltage values of 0 V and +0.1 V may both be represented by a bit pattern of 0000 in the bit information 214. While the description of this paragraph has referred specifically to a first stage 210, the other stages 220, 230, 240 may function similarly, but may convert a residue voltage 212, 222, 232 (instead of analog input voltage 202) into bit information 224, 234, 244, respectively, that may include a bit pattern.

A stage 210, 220, 230 of the ADC pipeline may provide a residue voltage 212, 222, 232 to the next stage 220, 230, 240, respectively. A residue voltage 212, 222, 232 may undergo signal conditioning (such as the signal conditioning described in connection with an analog input voltage 202) to approximately match its range (such as via amplification/attenuation and offsetting) to a stage 220, 230, 240. As described with respect to a first stage 210, stages 210, 220, 230, 240 may receive an analog input voltage or residue voltage and convert it into corresponding bit information 214, 224, 234, 244, such as a bit pattern. As described elsewhere with respect to a first stage 210, stages 210, 220, 230 may calculate or create a residue voltage 212, 222, 232, respectively. In various examples, the last stage 240 may not calculate or create a residue voltage, as there may not be a stage that receives such a signal from the last stage 240.

Stages 210, 220, 230, 240 may be identical or they may be different. As a last stage 240 may not provide a residue voltage to any other components, the last stage 240 may be designed differently by omitting portions associated with calculating or creating a residue voltage (such as a digital-to-analog converter and amplifier). Stages 210, 220, 230, 240 may convert their analog input voltage 202 or residue voltages 212, 222, 232 into the same number of bits for bit information 214, 224, 234, 244, or into a different number of bits. For example, the first three stages 210, 220, 230 may produce 4 bits for bit information 214, 224, 234, respectively, with the last stage 240 producing 5 bits for bit information 244. The last stage 240 may produce a different number of bits, because it may be able to spend more time performing an analog to digital conversion, as it may not need to provide a residue voltage.

In an ADC pipeline 200, an analog input signal may be broken up into multiple analog input voltage 202 values over time and sent through the stages in a pipeline format. For example, an analog input signal may have a first, second, third, fourth (and may have more) analog input voltage 202 values representing the voltage value of an analog input signal at 150 picosecond time intervals. These analog input voltage 202 values may be different as the analog input signal changes over time. For example, the ADC pipeline 200 may be converting a sine wave with a period of 1000 picoseconds, and the voltage value of the sine wave at every 150 picoseconds is the analog input voltage 202. A first analog input voltage 202 value may be provided to the first stage 210. A second analog input voltage 202 value may be provided to the first stage 210, as bit information 214 corresponding to the first analog input voltage 202 value is provided to a time alignment unit 250 and the residue voltage 212 corresponding to a first analog input voltage 202 value is provided to the second stage 220. A third analog input voltage 202 value may be provided to the first stage 210, as bit information 214 corresponding to the second analog input voltage 202 value is provided to the time alignment unit 250, and the residue voltage 212 corresponding to the second analog input voltage value 202 is provided to the second stage 220. At the same time, bit information 224 corresponding to a first analog input voltage 202 value may be provided to a time alignment unit 250 and a residue voltage 222 corresponding to a first analog input voltage value may be provided to a third stage 230. This may continue in a pipelined fashion as the analog input voltage 202 and residue voltages 212, 222, 232 are pipelined through the stages 210, 220, 230, 240. The operation of each stage 210, 220, 230 240 of an ADC pipeline 200 may be designed to take approximately the same amount of time. Bit information 214, 224, 234, 244 corresponding to a first analog input voltage value may be provided to the time alignment unit 250 at different points in time.

The time alignment unit 250 may be used to collect the bit information 214, 224, 234, 244 for analog input voltage 202 values over time and align the bit information 214, 224, 234, 244 to correspond to the same analog input voltage 202 value and corresponding residue voltages 212, 222, 232. The time alignment unit may combine the bit information 214, 224, 234, 244 to provide a digital output value 260 corresponding to an analog input voltage 202 value. In various examples the time alignment unit may concatenate the bit information 214, 224, 234, 244 together (e.g., values of 0000, 0110, 0001, and 1101 may combine to form 0000 0110 0001 1101). In various examples, number of bits in bit information 214, 224, 234, 244 may be different than the number of bits for the digital output value 260. The time alignment unit 250 may perform calculations to produce a digital output value 260 based on the bit information 214, 224, 234, 244. For example, the first and second stages 210, 220 may provide 4 bits of bit information 214, 224 each, which the time alignment unit may combine into the 6 most significant bits of the digital output value 260. The time alignment unit 250 may also detect errors by comparing the bit information 214, 224, 234, 244 of different stages 210, 220, 230, 240. One example of an error may be a gain error, where the residue voltage 212, 222, 232 is amplified by an incorrect value (e.g., a 3.9 gain instead of a 4.0 gain). Another error may be a memory error, such as where a stage 210, 220, 230, 240 does not fully reset between operations and may have some leftover charge on a capacitor or a sub-ADC that has not fully reset. The time alignment unit 250 may be able to correct some errors.

By way of example, a pipelined ADC may have a range of −5 V to +5V and it may be provided with an analog input voltage 202 value of +1.2374 V. A first stage 210 may determine if analog input voltage 202 is positive or negative and the value of its ones digit (1 in this example) as bit information 214 and calculate a residue voltage 212 (+0.2374 in this example). A second stage 220 may determine the tenths digit (2 in this example) as bit information 224 and calculate a residue voltage 222 (+0.0374 in this example). A third stage 230 may determine the hundredths digit (3 in this example) as bit information 234 and calculate a residue voltage 232 (+0.0074 in this example). A fourth stage 240 may determine the thousandths digit (7 in this example) as bit information 244, but not calculate a residue voltage (+0.0004 in this example) as there may be no subsequent stage. A time alignment unit 250 may combine the bit information 214, 224, 234, 244 into +1.237 as a digital representation of the input voltage's 202 voltage value of +1.2374. The +0.0004 V difference may be due to the resolution of the ADC pipeline 200. In various examples, the stages 210, 220, 230, 240 may not correspond directly to a single decimal digit. In various examples, the residue voltages 212, 222, 232 may be amplified to match an input range of a next stage 220, 230, 240. In various examples, the first stage 210 may be designed to convert positive and negative voltages, while other stages 220, 230, 240 may be designed to only convert positive (or only negative) voltages.

Figure 3:
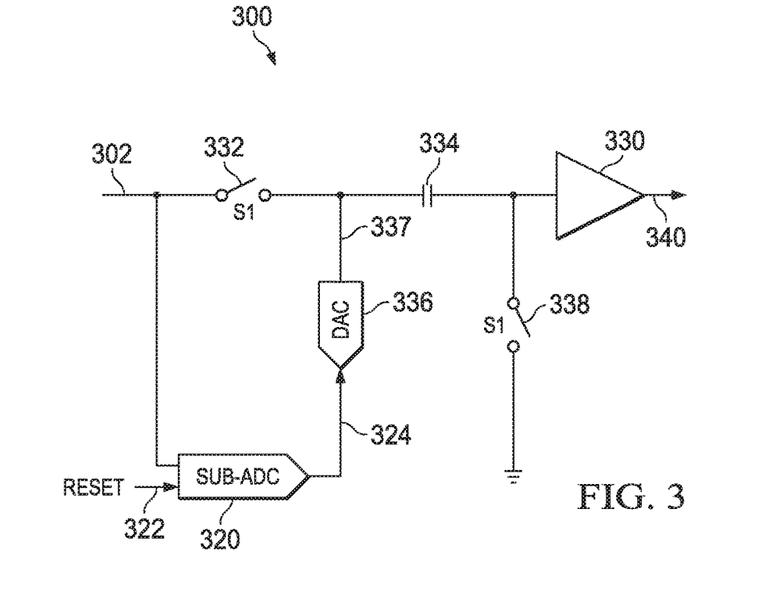
FIG. 3 depicts a simplified circuit schematic diagram of an ADC pipeline stage, in accordance with various examples.

FIG. 3 depicts a simplified circuit schematic of an example ADC pipeline stage 300, in accordance with various examples. Stage 300 of FIG. 3 may represent the stages 210, 220, 230, 240 of the ADC pipeline 200 of FIG. 2. Stage 300 may include an input voltage 302, which may be converted into a bit value 324 and a remainder 340. The bit value 324 may be provided as bit information 214, 224, 234, 244 provided by stage 300. Remainder 340 of FIG. 3 may be provided as, or may be modified to be, a residue voltage 212, 222, 232 to another stage 220, 230, 240, respectively, of FIG. 2. Stage 300 may include switches 332, 338. Switches 332, 338 may be controlled by a signal S1 to be in an open or closed position. Other switches may be present that are opened or closed by S1 or another signal. Stage 300 may include a capacitor 334. Stage 300 may include a sub-ADC 320, a digital to analog converter 336, and a reset signal 322. Stage 300 may include an amplifier 330.

An input voltage 302 may be provided for conversion to a digital value by the sub-ADC 320. The sub-ADC 320 may be reset by assertion of a reset signal 322. Resetting the sub-ADC 320 may configure the sub-ADC 320 to provide minimal distortion or disruption of an input voltage 302, such as by setting the sub-ADC 320 in a high-impedance state. Sub-ADC 320 may perform an analog to digital conversion of the input voltage 302 when the reset signal 322 is deasserted, and not when the reset signal 322 is asserted. Other signals may additionally limit when the analog to digital conversion is performed. When a sub-ADC 320 is reset by a reset signal 322, a bit value 324 from the sub-ADC may remain the same value as before the reset signal 322 was asserted (e.g., the bit value 324 may be latched and not reset with assertion of the reset signal 322).

Sub-ADC 320 may be a flash ADC or SAR (successive approximation register) ADC, though any ADC that meets the timing and other requirements of the overall system may be used. DAC 336 may be a switched resistor DAC, switched current (or voltage) source DAC, switched capacitor DAC, or any other DAC that meets the timing and other requirements of the overall system. The output of DAC 336 may be controlled, such as by a switch, to allow the stage 300 to control flow of the DAC's 336 output to other parts of stage 300. For example, the output of DAC 336 may be a high impedance while S1 is asserted and the converted analog signal may be provided to capacitor 334 while S1 is deasserted (and may be further conditioned on additional control signals). In various examples, bit value 324 may be a single bit or multiple bits, with sub-ADC 320 and DAC 336 being single-bit or multiple-bit ADCs or DACs.

Generally, the input voltage 302 may flow through switch 332 and be stored on capacitor 334. Input voltage 302 may be converted by sub-ADC 320 to produce a bit value 324 that is output from the stage 300. Bit value 324 may also be coupled to DAC 336 to produce an internal analog signal 337, which may be an analog voltage output of the DAC 336. Internal analog signal 337 may be an analog voltage value that corresponds to the input voltage 302 value. In various examples, internal analog signal 337 may be a voltage value that represents bit value 324, which is in turn a digital representation of input voltage 302 value. For example, input voltage 302 may be 6.25 V, which may correspond to a bit value of 0101, which in turn represents a value of 5.5 V, which may be the value output by DAC 336 as an internal analog signal 337. Internal analog signal 337 may be coupled to capacitor 334 in a way to effect a voltage subtraction. For example, an input voltage 302 value of 6.25 V may be stored on capacitor 334, and internal analog signal 337 with a value of 5.5 V may be coupled to capacitor 334 to create a voltage drop of 0.75 V seen by capacitor 334. Amplifier 330 may see the 0.75 V drop and produce the remainder 340. In various examples, amplifier 330 may amplify the signal so that the potential range of remainder 340 closely matches the range of a next stage 220, 230, 240 in an ADC pipeline 200. In various examples, amplifier 330 may act as a buffer so that remainder 340 may be properly used by a next stage 220, 230, 240 with minimal distortion or disruption of the voltage value of remainder 340. Conceptually, stage 300 samples the voltage value of input voltage 302 on capacitor 334, calculates a bit value corresponding to the input voltage 302 value, subtracts from the input voltage 302 value stored on the capacitor 334 the value it calculated, and passes along a remainder 340 of the input voltage 302 value of the stage 300 for further analysis.

Figure 4:
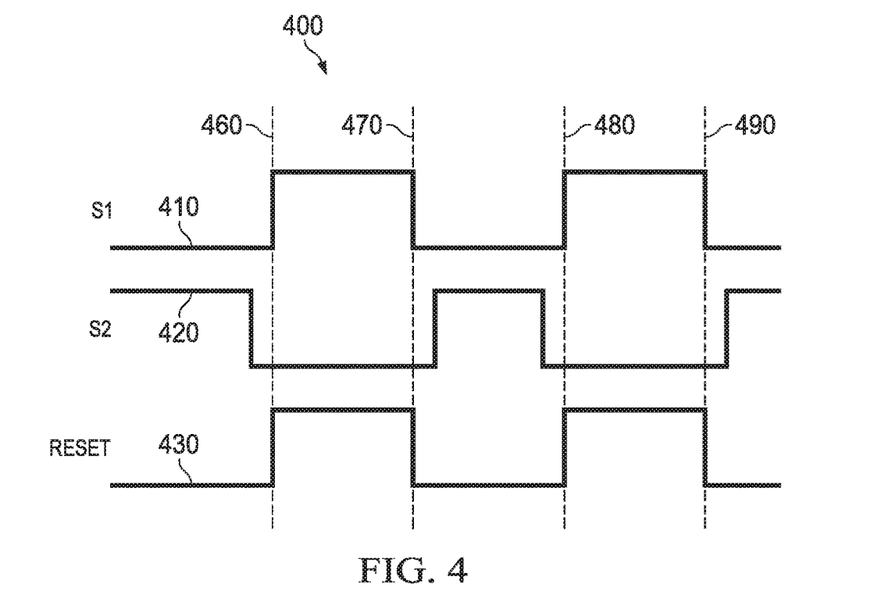
FIG. 4 depicts a timing diagram, in accordance with various examples.

FIG. 4 depicts a timing diagram 400, in accordance with various examples. The timing diagram 400 of FIG. 4 may be used with the ADC pipeline stage 300 depicted in FIG. 3. Timing diagram 400 may include S1 410, which corresponds to signal S1 in FIG. 3, and which alternates between a high voltage value and a low voltage value. Timing diagram 400 may include S2 620, which alternates between a high voltage value and a low voltage value (S2 is discussed in connection with FIG. 7, but may also be used for timing of additional circuitry associated with the system). Timing diagram 400 may include RESET 430. Hashed lines indicate a first point in time 460, a second point in time 470, a third point in time 480, and a fourth point in time 490. In various examples, S1 410 and S2 420 may alternate between high and low voltage values in sync with (or acting as) clock signals. In various examples, S1 410 and S2 420 may be designed so that only one of the two signals is at a high voltage value (or a low voltage value) at a time. For example, S1 410 may transition from low to high at a first point in time 460 and a third point in time 480 and from high to low at a second and fourth point in time 470, 490, while S2 may transition from high to low shortly before the first point in time 460 and third point in time 480 and transition from low to high shortly after the second point in time 470 and fourth point in time 490. In various examples, RESET 430 may largely track S1 410. In various examples, RESET 430 may be considered asserted at a high voltage value, such as between a first point in time 460 and a second point in time 470. In various examples, RESET may be considered asserted at a low voltage value, such as between a second point in time 470 and a third point in time 480. Although FIG. 4 depicts S1 410, S2 420, and RESET 430 as square waves, in various examples these signals may have more sloped transitions between the high and low voltage values. In various examples, these signals may transition between high and low values at different points in time than those depicted in FIG. 4 (and not in sync with the same signals as depicted in FIG. 4).

Signals may be asserted while other signals are also asserted (or deasserted). Similarly, events or operations may take place while signals are asserted (or deasserted) or while other events or operations take place. "While" means that there is some temporal overlap in the conditions or events. For example, S1 410 is asserted while RESET 430 is asserted, as there is some temporal overlap when they are both asserted (e.g., between a first point in time 460 and a second point in time 470). S1 410 is asserted while S2 420 is deasserted, as there is some temporal overlap in the conditions (e.g., between a first point in time 460 through a second point in time 470), even though both are deasserted shortly before a first point in time 460 and shortly after a second point in time 470.

The block diagram of FIG. 3 will now be described in relationship with the timing diagram of FIG. 4. Between first 460 and second 470 points in time, S1 410 and RESET 430 may be asserted. An asserted S1 signal 410 may cause switches 332, 338 to be in closed positions. Input voltage 302 may be provided via switch 332 to one side of capacitor 334 at the same time the other side of capacitor 334 is grounded via switch 338. The internal analog signal 337 output by DAC 336 may be a high impedance state. This may allow capacitor 334 to store a charge representative of input voltage 302. Input voltage 302 may be provided to sub-ADC 320, but sub-ADC 320 may not convert input voltage 302 to a digital value because reset signal 322 is asserted as shown by RESET 430.

Between second 470 and third 480 points in time, S1 410 and RESET 430 may be deasserted. A deasserted S1 410 may cause switches 332, 338 to be in open positions. Capacitor 334 may initially still store a charge representative of input voltage 302. Sub-ADC 320 may convert input voltage 302 to a bit value 324, as reset signal 322 is deasserted (as shown by RESET 430). DAC 336 may output an internal analog signal 337 based on the bit value 324 from the sub-ADC 320. The output of an internal analog signal 337 by DAC 336 may be further controlled by additional signals not depicted here. By placing an internal analog signal 337 on capacitor 334, an analog mathematical operation may be performed. For example, if capacitor 334 is storing a +5 V value and DAC 336 places a +4.5 V value on the capacitor (a 0.5 V drop), the other plate of the capacitor may experience a drop from 0 V (from when it was grounded) to −0.5 V. In various examples, the 0.5 V change may represent a difference between the resolution of sub-ADC 320 and the voltage value of input voltage 302. Amplifier 330 may detect the resulting voltage and amplify (or buffer) the resulting voltage value on its input to produce remainder 340. Amplifier 330 may also reverse the polarity, e.g., so that a negative voltage value on its input produces a positive voltage value on its output.

After a third point in time a different input voltage 302 value may be provided to stage 300 to be converted to a bit value 324 and remainder 340.

Figure 5:
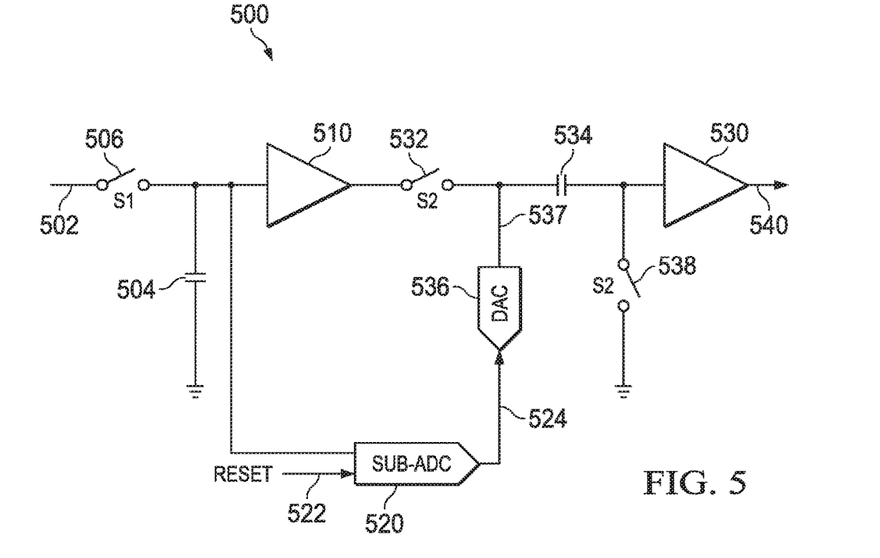
FIG. 5 depicts a simplified circuit schematic diagram of an ADC pipeline stage, in accordance with various examples.

FIG. 5 depicts a simplified circuit schematic of an ADC pipeline stage, in accordance with various examples. Stage 500 of FIG. 5 may represent a stage 210, 220, 230, 240 of the ADC pipeline 200 of FIG. 2. Stage 500 may include an input voltage 502, which may be converted into a bit value 524 and a remainder 540. A bit value 524 may be provided as some or all of the bit information 214, 224, 234, 244 provided by stage 500. Remainder 540 of FIG. 5 may be provided as, or may be modified to be, a residue voltage 212, 222, 232 to another stage 220, 230, 240 of FIG. 2. Stage 500 may include switches 506, 532, 538. Switch 506 may be controlled by a signal S1 to be in an open or closed position. Switches 532, 538 may be controlled by a signal S2 to be in an open or closed position. Other switches may be present that are opened or closed by signals S1, S2, or another signal. Stage 500 may include capacitors 504, 534. Stage 500 may include a sub-ADC 520, a DAC 536, and a reset signal 522. Stage 500 may include a buffer 510. Stage 500 may include an amplifier 530.

An input voltage 502 may be provided for conversion to a digital value by the sub-ADC 520. The sub-ADC 520 may be reset by assertion of a reset signal 522. Resetting a sub-ADC 520 may configure the sub-ADC 520 to provide minimal distortion or disruption of an input voltage 502, such as by setting the sub-ADC 520 in a high-impedance state. Sub-ADC 520 may perform an analog to digital conversion of the input voltage 502 when the reset signal 522 is deasserted, and not when the reset signal 522 is asserted. Other signals may additionally limit when the analog to digital conversion is performed. When a sub-ADC 520 is reset by a reset signal 522, a bit value 524 from the sub-ADC may remain the same value as before the reset signal 522 was asserted (e.g., the bit value 524 may be latched and not reset with assertion of the reset signal 522).

Sub-ADC 520 may be a flash ADC or SAR ADC, though any ADC that meets the timing and other requirements of the overall system may be used. DAC 536 may be a switched resistor DAC, switched current (or voltage) source DAC, switched capacitor DAC, or any other DAC that meets the timing and other requirements of the overall system. The output of DAC 536 may be controlled, such as by a switch, to allow the stage 500 to control flow of the DAC's 536 output to other parts of stage 500. For example, the output of DAC 536 may be a high impedance while S2 is asserted, and the converted analog signal may be provided to capacitor 534 while S2 is deasserted (and may be further conditioned on additional control signals). In various examples, bit value 524 may be a single bit or multiple bits, with sub-ADC 520 and DAC 536 being single-bit or multiple bit ADCs or DACs.

Generally, the input voltage 502 may be stored on capacitor 504. Buffer 510 may provide the input voltage 502 value that was stored on capacitor 504 to be stored on capacitor 534 via buffer 510 and switch 532. The input voltage 502 value stored on capacitor 504 may be converted by sub-ADC 520 to produce a bit value 524 that is output from the stage 500. Bit value 524 may also be coupled to DAC 536 to produce an internal analog signal 537, which may be an analog voltage output of the DAC 536. Internal analog signal 537 may be an analog voltage value that corresponds to the input voltage 502 value. In various examples, internal analog signal 537 may be a voltage value that represents bit value 524, which is in turn a digital representation of input voltage 502 value. For example, input voltage 502 may be 6.25 V, which may correspond to a bit value of 0101, which in turn represents a value of 5.5 V, which may be the value output by DAC 536 as an internal analog signal 537. Internal analog signal 537 may be coupled to capacitor 534 in a way to effect a voltage subtraction. For example, an input voltage 502 value of 6.25 V may be stored on capacitor 534, and internal analog signal 537 with a value of 5.5 V may be coupled to capacitor 534 to create a voltage drop of 0.75 V seen by capacitor 534. Amplifier 530 may see the 0.75 V drop and produce a remainder 540. In various examples, amplifier 530 may amplify the signal so that the potential range of remainder 540 closely matches the range of a next stage 220, 230, 240 in an ADC pipeline 200. In various examples, amplifier 530 may act as a buffer so that remainder 540 may be properly used by a next stage 220, 230, 240 with minimal distortion or disruption of the voltage value of remainder 540. Conceptually, stage 500 samples the voltage value of input voltage 502 on capacitor 504, buffers the voltage value (to create additional time for the sub-ADC 520 and DAC 536 to finish operations) to store on capacitor 534, calculates a bit value corresponding to the input voltage 502 value, subtracts from the input voltage 502 value stored on the capacitor 534 the value it calculated, and passes along a remainder 540 of the input voltage 502 value of the stage 500 for further analysis.

Figure 6:
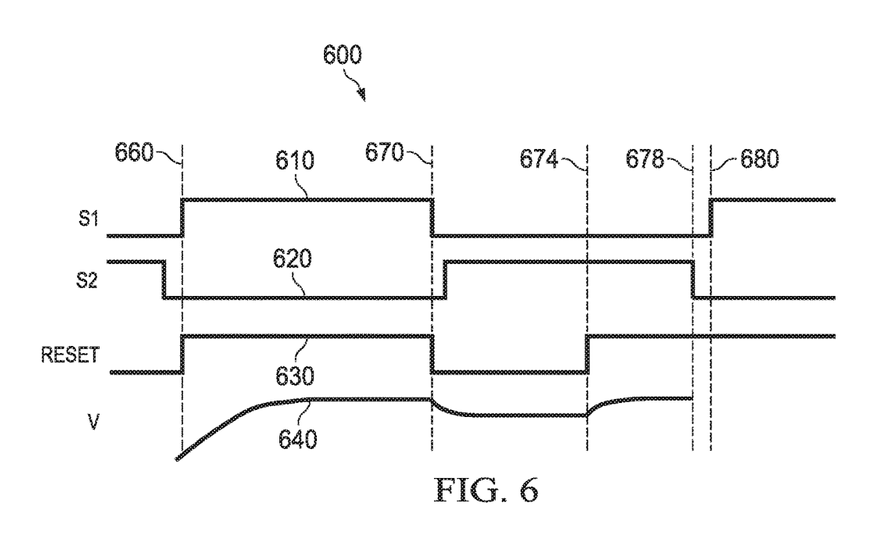
FIG. 6 depicts a timing diagram, in accordance with various examples.

FIG. 6 depicts a timing diagram 600 in accordance with various examples. The timing diagram 600 of FIG. 6 may be used with the ADC pipeline stage 500 depicted in FIG. 5. Timing diagram 600 may include S1 610, which alternates between a high voltage value and a low voltage value. Timing diagram 600 may include S2 620, which alternates between a high voltage value and a low voltage value. Timing diagram 600 may include RESET 630. Timing diagram may include a voltage plot 640. Hashed lines indicate a first point in time 660, a second point in time 670, a third point in time 680, a reset assertion point in time 674, and a S2 deassertion point in time 678. Timing diagram 600 of FIG. 6 depicts a reset assertion point in time 674 and S2 deassertion point in time 678 occurring between a second point in time 670 and a third point in time 680. In various examples, S1 610 and S2 620 may alternate between high and low voltage values in synch with (or acting as) clock signals. In various examples, S1 610 and S2 620 may be designed so that only one of the two signals is at a high voltage value (or a low voltage value) at a time (sometimes called non-overlapping signals). For example, S1 610 may transition from low to high at a first point in time 660 and a third point in time 680 and from high to low at a second point in time 670, while S2 may transition from high to low shortly before the first point in time 660 and at a S2 deassertion point in time 678 (shortly before the third point in time 680) and transition from low to high shortly after the second point in time 670. In various examples, RESET 630 may transition from an asserted to a deasserted state at a second point in time 670 and transition from a deasserted to an asserted state at a reset assertion point in time 674. In various examples, RESET 430 may be considered asserted at a high voltage value, such as between a first point in time 660 and a second point in time 670. In various examples, RESET may be considered asserted at a low voltage value, such as between a second point in time 670 and a reset assertion point in time 674 (though for purposes of this description, RESET is considered asserted at a high voltage value). Although FIG. 6 depicts S1 610, S2 620, and RESET 630 as square waves, in various examples these signals may have more sloped transitions between the high and low voltage values. In various examples, these signals may transition between high and low values at different points in time than those depicted in FIG. 6 (and not in sync with the same signals as depicted in FIG. 6).

The block diagram of FIG. 5 will now be described in relationship with the timing diagram of FIG. 6. Between first 660 and second 670 points in time, S1 610 and RESET 630 may be asserted. An asserted S1 610 may cause switch 506 to be in a closed position. Input voltage 502 may be provided via switch 506 to one side of capacitor 504 while the other side of capacitor 504 is grounded. Capacitor 504 may charge up and store the voltage value of the input voltage 502. Voltage plot 640 may show an exemplary voltage as seen at the analog voltage input of the sub-ADC 520. The voltage plot 640 may transition to a voltage value of the input voltage 502 between a first point in time 660 and a second point in time 670, as capacitor 504 is charged.

At a second point in time 670, S1 610 and RESET 630 may transition to a deasserted state. A deasserted S1 may cause switch 506 to be in an open position. Initially, capacitor 504 may store a charge indicating the voltage value of input voltage 502, but it may be distorted soon after the reset signal 522 is deasserted. Shortly after a second point in time 670, S2 may change to an asserted state, which may cause switches 532, 538 to be closed. The voltage value stored on capacitor 504 may be provided to buffer 510, and the output of buffer 510 may be provided to capacitor 534 via switch 532. Capacitor 534 may be charged to store the voltage value of input voltage 502, as provided by the input voltage 502 to capacitor 504, then to buffer 510, then to capacitor 534 via switch 532, while the other plate of capacitor 534 is grounded via switch 538. As the voltage value stored on capacitor 504 is provided to capacitor 534, it may already be being distorted by the sub-ADC 520 as it transitions away from a reset state. Sub-ADC 520 may convert the voltage value of input voltage 502 stored on capacitor 504 to a bit value 524, as reset signal 522 is deasserted (as shown by RESET 630). The internal analog signal 537 output by DAC 536 may be in a high impedance state. Voltage plot 640 may show how the voltage at the analog input to the sub-ADC 520 is affected by operation of the sub-ADC 520, when RESET 630 is deasserted. As the voltage value is being supplied by a capacitor 504, charge sharing may occur between capacitor 504 and capacitors inside the sub-ADC 520 that distort the voltage plot 640. The distortion on voltage plot 640 may be due to the sub-ADC changing its operating conditions in response to the deassertion of RESET 630. This distortion may also be passed along by buffer 510 to capacitor 534. The distortion may not be enough to significantly affect the resulting bit value 524 of the sub-ADC 520, but may introduce an error in the remainder 540 and affect the bit value 524 of subsequent stages 500.

At a reset assertion point in time 674, RESET 630 may transition to an asserted state. The time between a second point in time 670 and a reset point in time 674 may be sufficient time for the sub-ADC 520 to convert the analog input into a digital bit value 524. The bit value 524 output of the sub-ADC 520 may be latched to hold its value when sub-ADC 520 is reset. When sub-ADC 520 is reset, voltage plot 640 may recover between a reset assertion point in time 674 and an S2 deassertion point in time 678 to represent the voltage level of input voltage 502 that was stored on capacitor 504 just prior to a second point in time 670. This may be due to the charge sharing condition ending when the sub-ADC 520 is being reset. This recovered voltage level may be provided to buffer 510 and then to capacitor 534 via switch 532. As the difference between the recovered voltage level and pre-recovery level may be small, only a small amount of time may be necessary to charge the capacitor 534 to the recovered voltage level.

At an S2 deassertion point in time 678, S2 620 may transition to a deasserted state and cause switches 532, 538 to be in an open position. At a third point in time 680, S1 610 may transition to an asserted state and cause switch 506 to be in a closed position. DAC 536 may output an internal analog signal 537 based on the bit value 524 from the sub-ADC 520. By placing an internal analog signal 537 on capacitor 534, an analog mathematical operation may be performed. For example, if capacitor 534 is storing a +5 V value and DAC 536 places a +4.5 V value on the capacitor (a 0.5 V drop), the other plate of the capacitor may experience a drop from 0 V (from when it was grounded) to −0.5 V. In various examples, the 0.5 V change may represent a difference between the resolution of sub-ADC 520 and the voltage value of input voltage 502. Amplifier 530 may detect the voltage change and amplify (or buffer) the resulting voltage value on its input to produce remainder 540. Amplifier 530 may also reverse the polarity, e.g., so that a negative voltage value on its input produces a positive voltage value on its output. While stage 500 calculates a remainder 540, a different input voltage 502 value may provided to capacitor 504 via switch 506 to be converted to a bit value 524 and remainder 540 by operation of stage 500.

Figure 7:
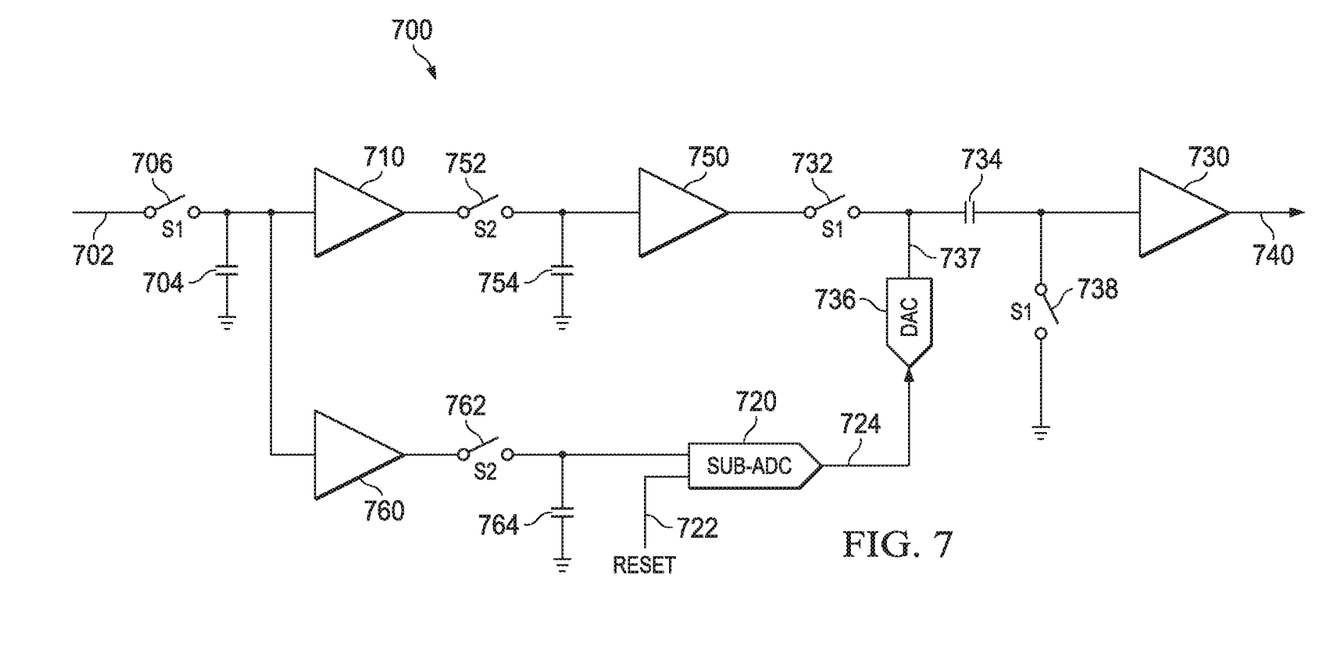
FIG. 7 depicts a simplified circuit schematic diagram of an ADC pipeline stage, in accordance with various examples.

FIG. 7 depicts a simplified circuit schematic of an ADC pipeline stage, in accordance with various examples. Stage 700 of FIG. 7 may represent a stage 210, 220, 230, 240 of an ADC pipeline 200 of FIG. 2. Stage 700 may include an input voltage 702, which may be converted into a bit value 724 and a remainder 740. A bit value 724 may be provided as some or all of the bit information 214, 224, 234, 244 provided by stage 700. Remainder 740 of FIG. 7 may be provided as, or may be modified to be, a residue voltage 212, 222, 232 to another stage 220, 230, 240 of FIG. 2. Stage 700 may include switches 706, 732, 738, 752. Switches 706, 732, 738 may be controlled by a signal S1 to be in an open or closed position. Switch 752 may be controlled by a signal S2 to be in an open or closed position. Other switches may be present that are opened or closed by S1, S2, or another signal. Stage 700 may include capacitors 704, 734, 754. Stage 700 may include a sub-ADC 720, a DAC 736, and a reset signal 722. Stage 700 may include buffers 710, 750, 760. Stage 700 may include an amplifier 730.

An input voltage 702 may be provided for conversion to a digital value by a sub-ADC 720. The sub-ADC 720 may be reset by assertion of a reset signal 722. Resetting a sub-ADC 720 may configure the sub-ADC 720 to provide minimal distortion or disruption of an input voltage 702, such as by setting the sub-ADC 720 in a high-impedance state. Sub-ADC 720 may perform an analog to digital conversion of the input voltage 702 when the reset signal 722 is deasserted, and not when the reset signal 722 is asserted. When a sub-ADC 720 is reset by a reset signal 722, a bit value 724 from the sub-ADC may remain the same value as before the reset signal 722 was asserted (e.g., they may be latched and not reset with assertion of the reset signal 722).

Sub-ADC 720 may be a flash ADC, though any ADC that meets the timing and other requirements of the overall system may be used. DAC 736 may be a switched resistor DAC, switched current (or voltage) source DAC, or any other DAC that meets the timing and other requirements of the overall system. The output of DAC 736 may be controlled, such as by a switch, to allow the stage 700 to control flow of the DAC's 736 output to other parts of stage 700. In various examples, bit value 724 may be a single bit or multiple bits, with sub-ADC 720 and DAC 736 being single-bit or multiple bit ADCs or DACs.

Generally, the input voltage 702 may be stored on capacitor 704. Buffer 710 may provide the input voltage 702 value that was stored on capacitor 704 to be stored on capacitor 754 via switch 752. The input voltage 702 value stored on capacitor 754 may be provided to capacitor 734 via buffer 750 and switch 732. The input voltage 702 value stored on capacitor 704 may be provided to sub-ADC 720 via buffer 760 and converted by sub-ADC 720 to produce a bit value 724 that is output from the stage 700. Bit value 724 may also be coupled to DAC 736 to produce an internal analog signal 737. Internal analog signal 737 may be an analog voltage value that corresponds to the input voltage 702 value. In various examples, internal analog signal 737 may be a voltage value that represents bit value 724, which is in turn a digital representation of input voltage 702 value. For example, input voltage 702 may be 6.25 V, which may correspond to a bit value of 0101, which in turn represents a value of 5.5 V, which may be the value output by DAC 736 as an internal analog signal 737. Internal analog signal 737 may be coupled to capacitor 734 in a way to effect a voltage subtraction. For example, an input voltage 702 value of 6.25 V may be stored on capacitor 734, and internal analog signal 737 with a value of 5.5 V may be coupled to capacitor 734 to create a voltage drop of 0.75 V seen on capacitor 734. Amplifier 730 may see the 0.75 V drop and produce a remainder 740. In various examples, amplifier 730 may amplify the signal so that the potential range of remainder 740 closely matches the range of a next stage 220, 230, 240 in an ADC pipeline 200. In various examples, amplifier 730 may act as a buffer so that remainder 740 may be properly used by a next stage 220, 230, 240 with minimal distortion or disruption of the voltage value of remainder 740. Conceptually, stage 700 samples the voltage value of input voltage 702 on capacitor 704, buffers the voltage value to store on capacitor 754, buffers the voltage to store on capacitor 734, calculates a bit value corresponding to the input voltage 702 value, subtracts from the input voltage 702 value stored on the capacitor 734 the value it calculated, and passes along a remainder 740 of the input voltage 702 value of the stage 700 for further analysis.

FIG. 7 depicts a simplified circuit schematic diagram of an ADC pipeline stage, in accordance with various examples. Stage 700 of FIG. 7 may represent a stage 210, 220, 230, 240 of the ADC pipeline 200 of FIG. 2. Stage 700 may include an input voltage 702, which may be converted into a bit value 724 and a remainder 740. A bit value 724 may be provided as some or all of the bit information 214, 224, 234, 244 provided by stage 700. Remainder 740 of FIG. 7 may be provided as, or may be modified to be, a residue voltage 212, 222, 232 to another stage 220, 230, 240 of FIG. 2. Stage 700 may include switches 706, 732, 738, 752, 762. Switches 706, 732, 738 may be controlled by a signal S1 to be in an open or closed position. Switches 762, 752 may be controlled by a signal S2 to be in an open or closed position. Other switches may be present that are opened or closed by signals S1, S2, or another signal. Stage 700 may include capacitors 704, 734, 754, 764. Stage 700 may include a sub-ADC 720, a DAC 736, and a reset signal 722. Stage 700 may include a buffer 710. Stage 700 may include an amplifier 730.

An input voltage 702 may be provided for conversion to a digital value by the sub-ADC 720. The sub-ADC 720 may be reset by assertion of a reset signal 722. Resetting a sub-ADC 720 may configure the sub-ADC 720 to provide minimal distortion or disruption of an input voltage 702, such as by setting the sub-ADC 720 in a high-impedance state. Sub-ADC 720 may perform an analog to digital conversion of the input voltage 702 when the reset signal 722 is deasserted, and not when the reset signal 722 is asserted. Other signals may additionally limit when the analog to digital conversion is performed. When a sub-ADC 720 is reset by a reset signal 722, a bit value 724 from the sub-ADC may remain the same value as before the reset signal 722 was asserted (e.g., the bit value 724 may be latched and not reset with assertion of the reset signal 722).

Sub-ADC 720 may be a flash ADC or SAR ADC, though any ADC that meets the timing and other requirements of the overall system may be used. DAC 736 may be a switched resistor DAC, switched current (or voltage) source DAC, switched capacitor DAC, or any other DAC that meets the timing and other requirements of the overall system. The output of DAC 736 may be controlled, such as by a switch, to allow the stage 700 to control flow of the DAC's 736 output to other parts of stage 700. For example, the output of DAC 736 may be a high impedance while S1 is asserted, and the converted analog signal may be provided to capacitor 734 while S1 is deasserted (and may be further conditioned on additional control signals). In various examples, bit value 724 may be a single bit or multiple bits, with sub-ADC 720 and DAC 736 being single-bit or multiple bit ADCs or DACs.

Generally, the input voltage 702 may be stored on capacitor 704. Buffer 710 may provide the input voltage 702 value that was stored on capacitor 704 to be stored on capacitor 754 via buffer 710 and switch 752. Buffer 710 may provide the input voltage 702 value that was stored on capacitor 754 to be stored on capacitor 734 via buffer 750 and switch 732. Buffer 760 may provide the input voltage 702 value that was stored on capacitor 704 to be stored on capacitor 764 via buffer 760 and switch 762. The input voltage 702 value stored on capacitor 764 may be converted by sub-ADC 720 to produce a bit value 724 that is output from the stage 700. Bit value 724 may also be coupled to DAC 736 to produce an internal analog signal 737, which may be an analog voltage output of the DAC 736. Internal analog signal 737 may be an analog voltage value that corresponds to the input voltage 702 value. In various examples, internal analog signal 737 may be a voltage value that represents bit value 724, which is in turn a digital representation of input voltage 702 value. For example, input voltage 702 may be 6.25 V, which may correspond to a bit value of 0101, which in turn represents a value of 5.5 V, which may be the value output by DAC 736 as an internal analog signal 737. Internal analog signal 737 may be coupled to capacitor 734 in a way to effect a voltage subtraction. For example, an input voltage 702 value of 6.25 V may be stored on capacitor 734, and internal analog signal 737 with a value of 5.5 V may be coupled to capacitor 734 to create a voltage drop of 0.75 V seen by capacitor 734. Amplifier 730 may see the 0.75 V drop and produce a remainder 740. In various examples, amplifier 730 may amplify the signal so that the potential range of remainder 740 closely matches the range of a next stage 220, 230, 240 in an ADC pipeline 200. In various examples, amplifier 730 may act as a buffer so that remainder 740 may be properly used by a next stage 220, 230, 240 with minimal distortion or disruption of the voltage value of remainder 740. Conceptually, stage 700 samples the voltage value of input voltage 702 on capacitor 704, buffers and pipelines the voltage value to store on capacitor 734, calculates a bit value corresponding to the input voltage 702 value, subtracts from the input voltage 702 value stored on the capacitor 734 the value it calculated, and passes along a remainder 740 of the input voltage 702 value of the stage 700 for further analysis.

The block diagram of FIG. 7 will now be described in relationship with the timing diagram of FIG. 4. Between first 460 and second 470 points in time, S1 410 and RESET 430 may be asserted. An asserted S1 410 may cause switches 706, 732, 738 to be in a closed position. Input voltage 702 may be provided via switch 706 to one side of capacitor 704 while the other side of capacitor 704 is grounded. Capacitor 704 may charge up and store the voltage value of the input voltage 702.

At a second point in time 470, S1 410 and RESET 430 may transition to a deasserted state. A deasserted S1 420 may cause switches 706, 732, 738 to be in an open position. Capacitor 704 may store a charge indicating the voltage value of input voltage 702.

Shortly after a second point in time 470, S2 may change to an asserted state, which may cause switches 752, 762 to be closed. The voltage value stored on capacitor 704 may be provided to buffer 710, and the output of buffer 710 may be provided to capacitor 754 via switch 752. The voltage value stored on capacitor 704 may be provided to buffer 760, and the output of buffer 760 may be provided to capacitor 764 via switch 762. Capacitors 754, 764 may each be charged to store the voltage value of input voltage 702, as provided by the input voltage 702 to capacitor 704, then to buffers 710, 760, then to capacitors 754, 764 via switches 752, 762, while the capacitors 754, 764 are grounded. Sub-ADC 720 may convert the voltage value of input voltage 702 being stored on capacitor 764 to a bit value 724, as reset signal 722 is deasserted (as shown by RESET 430). In various embodiments, an additional signal may affect when sub-ADC 720 converts the voltage value to a bit value 724 (such as for slightly delaying the conversion till capacitor 764 has been charged to the voltage value of input voltage 702). The bit value 724 may be latched at a previous value passed through the pipeline, and DAC 736 may be outputting a signal from that previous value passed through the pipeline.

Slightly before a third point in time 480, S2 may become deasserted, causing switches 752, 762 to be in an open position.

At a third point in time 480, S1 may become asserted. An asserted S1 signal 410 may cause switches 706, 732, 738 to be in closed positions. The voltage value of input voltage 702 may be provided via buffer 750 and switch 732 to one side of capacitor 734 at the same time the other side of capacitor 734 is grounded via switch 738. The internal analog signal 737 output by DAC 736 may be a high impedance state. This may allow capacitor 734 to store a charge representative of input voltage 702. The bit value 724 corresponding to the voltage value of input voltage 702 may be latched as the output of sub-ADC 720. DAC 736 may convert the bit value 724 from the sub-ADC 720 into an analog signal, but output a high impedance as the internal analog signal 737.

At a fourth point in time 490, S1 may become deasserted. A deasserted S1 signal 410 may cause switches 706, 732, 738 to be in open positions. Capacitor 734 may store a charge representative of input voltage 702, as it has been passed along through the stage 700. After a fourth point in time 490, DAC 736 may output an internal analog signal 737 based on the latched bit value 724 from the sub-ADC 720. By placing an internal analog signal 737 on capacitor 734, an analog mathematical operation may be performed. For example, if capacitor 734 is storing a +5 V value and DAC 536 places a +4.5 V value on the capacitor (a 0.5 V drop), the other plate of the capacitor may experience a drop from 0 V (from when it was grounded) to −0.5 V. In various examples, the 0.5 V change may represent a difference between the resolution of sub-ADC 720 and the voltage value of input voltage 702. Amplifier 730 may detect the voltage change and amplify (or buffer) the resulting voltage value on its input to produce remainder 740. Amplifier 730 may also reverse the polarity, e.g., so that a negative voltage value on its input produces a positive voltage value on its output. While stage 700 calculates a remainder 740, a different input voltage 702 value may provided to capacitor 704 via switch 706 to be converted to a bit value 724 and remainder 740 by operation of stage 700.

Multiple voltage values of the input voltage 702 may be progressing through the stage 700 at the same time. For example, while a charge corresponding to a first voltage value of the input voltage 702 is being stored on capacitor 734, a second voltage value of the input voltage 702 may be being stored on capacitor 704.

Figure 8:
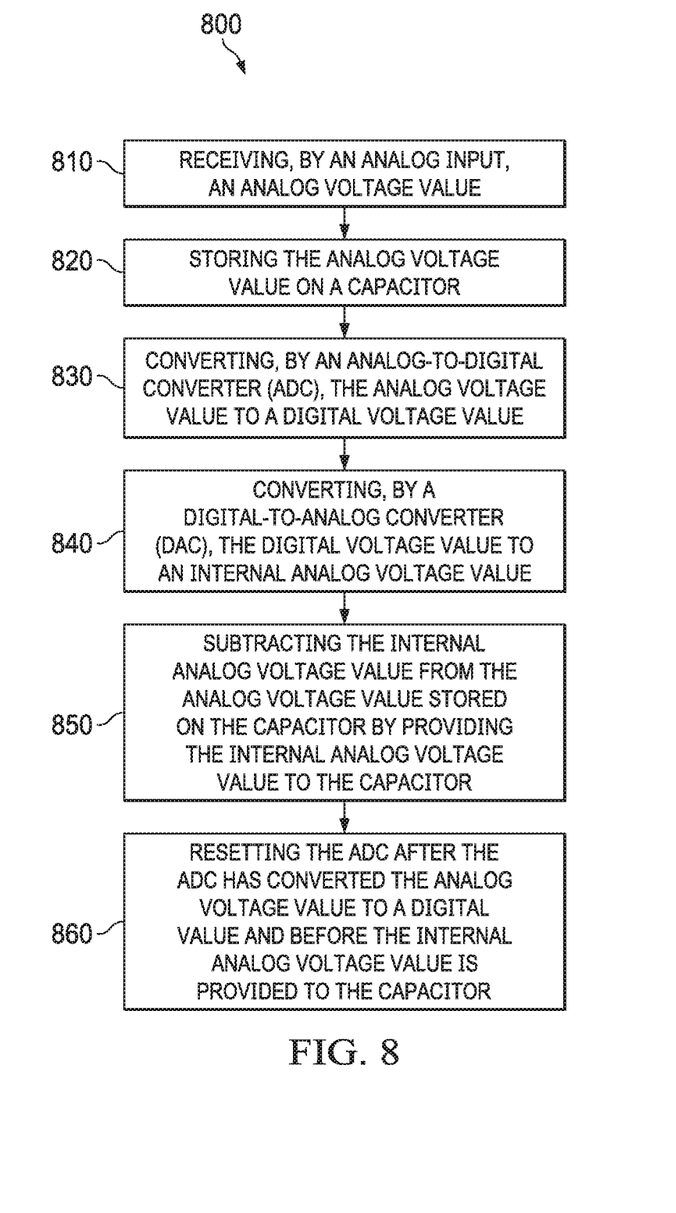
FIG. 8 depicts a flowchart of an ADC pipeline stage, in accordance with various examples.

FIG. 8 depicts a flowchart 800 of an ADC pipeline stage, in accordance with various examples. The method comprises receiving, by an analog input voltage, an analog voltage value (step 810). The method comprises storing the analog voltage value on a capacitor (step 820). The method comprises converting, by an analog-to-digital converter (ADC), the analog voltage value to a digital voltage value (step 830). The method comprises converting, by a digital-to-analog converter, the digital voltage value to an internal analog voltage value (step 840). The method comprises subtracting the internal analog voltage value from the analog voltage value stored on the capacitor by providing the internal analog voltage value to the capacitor (step 850). The method comprises resetting the ADC after the ADC has converted the analog voltage value to a digital value and before the internal analog voltage value is provided to the capacitor (step 860).

In addition, techniques, systems, subsystems, and methods described and illustrated in the various examples as discrete or separate may be combined or integrated with other systems, modules, techniques, or methods without departing from the scope of the present disclosure. Other items shown or described as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A system comprising:
   an analog-to-digital converter (ADC) to receive an analog input signal and a reset signal, the ADC to convert the analog input signal into a digital signal;
   a digital-to-analog converter (DAC), coupled to the ADC, to convert the digital signal into an internal analog signal;
   a buffer;
   a first capacitor, coupled to an output of the buffer, and an output of the DAC;
   a first switch, coupled between the buffer output and the first capacitor; and
   a second switch to couple the first capacitor to ground;
   a second capacitor coupled between an input to the buffer and ground; and
   a third switch, coupled to the buffer, the second capacitor, and the ADC, to provide the analog input signal to the buffer, the second capacitor, and the ADC while the reset signal is in an asserted state,
   the first switch to provide the analog input signal to the first capacitor while the second switch is in a closed state, and the reset signal is in a deasserted state, and
   the DAC to provide the internal analog signal to the first capacitor while the first switch is in an open state and the second switch is in an open state.

2. The system of claim 1, wherein the first and second switches are both controlled by a switch signal.

3. The system of claim 2, wherein the first capacitor is to output a modified analog signal based on the received internal analog signal and the analog input signal.

4. The system of claim 3, wherein the modified analog signal indicates a difference in voltage values of the received internal analog signal and the analog input signal.

5. The system of claim 3, further comprising:
an amplifier, coupled to the first capacitor, to amplify the modified analog signal.

6. The system of claim 1, wherein the third switch is in a closed state while the DAC provides the internal analog signal to the first capacitor, the first switch is in an open state, and the second switch is in an open state.

7. The system of claim 6, further comprising:
an amplifier, coupled to the first capacitor, to receive a modified analog signal, wherein the first capacitor is to output the modified analog signal based on the received internal analog signal and the analog input signal.

8. The system of claim 7, wherein the amplifier is part of a first stage and further comprising a second stage coupled to the first stage, wherein an output of the amplifier is an analog input signal to the second stage.

9. The system of claim 8 further comprising:
a time alignment unit to receive a digital signal of the first stage and a digital signal of the second stage and to combine the digital signal of the first stage with the digital signal of the second stage to indicate a voltage level of an analog input signal to the first stage.

10. The system of claim 1, further comprising:
a second buffer, coupled to the third switch, to provide the analog input signal to the third switch;
a third buffer, coupled to the ADC, to provide the analog input signal to the ADC;
a third capacitor coupled to ground; and
a fourth switch, coupled to the second buffer, the third buffer, and the third capacitor, to provide the analog input signal to the second buffer, the third buffer, and the third capacitor.

* * * * *